United States Patent
Choi et al.

(10) Patent No.: US 6,225,145 B1
(45) Date of Patent: May 1, 2001

(54) METHOD OF FABRICATING VACUUM MICRO-STRUCTURE

(75) Inventors: Chang Auck Choi; Jong Hyun Lee; Won Ick Jang; Dae Yong Kim, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/390,850

(22) Filed: Sep. 7, 1999

(30) Foreign Application Priority Data

Sep. 7, 1998 (KR) .................................................. 98-36777

(51) Int. Cl.[7] .................................................. H01L 21/44
(52) U.S. Cl. ............................................ 438/120; 438/127
(58) Field of Search ...................................... 438/120, 127

(56) References Cited

U.S. PATENT DOCUMENTS

| | | | |
|---|---|---|---|
| 5,354,714 | * 10/1994 | Boysel | 438/127 |
| 5,592,007 | * 1/1997 | Leedy | 257/347 |
| 5,834,334 | * 11/1998 | Leedy | 438/107 |
| 6,020,257 | * 2/2000 | Leedy | 438/626 |

* cited by examiner

Primary Examiner—John F. Niebling
Assistant Examiner—Lynne A. Gurley
(74) Attorney, Agent, or Firm—Antonelli, Terry, Stout & Kraus, LLP

(57) ABSTRACT

Provided is a method of fabricating a vacuum microstructure, which is used for an element operating in a vacuum, the method comprising the steps of: (1) entirely etching an epitaxial layer of a silicon substrate having an SOI structure including an upper silicon epitaxial layer, an interlevel insulating layer and a lower silicon bulk layer to form two electrode structures and a floating vibratory structure, and encapsulating them with a vacuum sealing substrate in a vacuum; and (2) etching the silicon substrate having the SOI stricture from the back side to the interlevel insulating layer to open the electrode structures, and forming a metal electrode.

9 Claims, 5 Drawing Sheets

METHOD OF FABRICATING VACUUM MICRO-STRUCTURE

BACKGROUND OF THE INVENTION

1. Field of the Invention

Figure 1A:
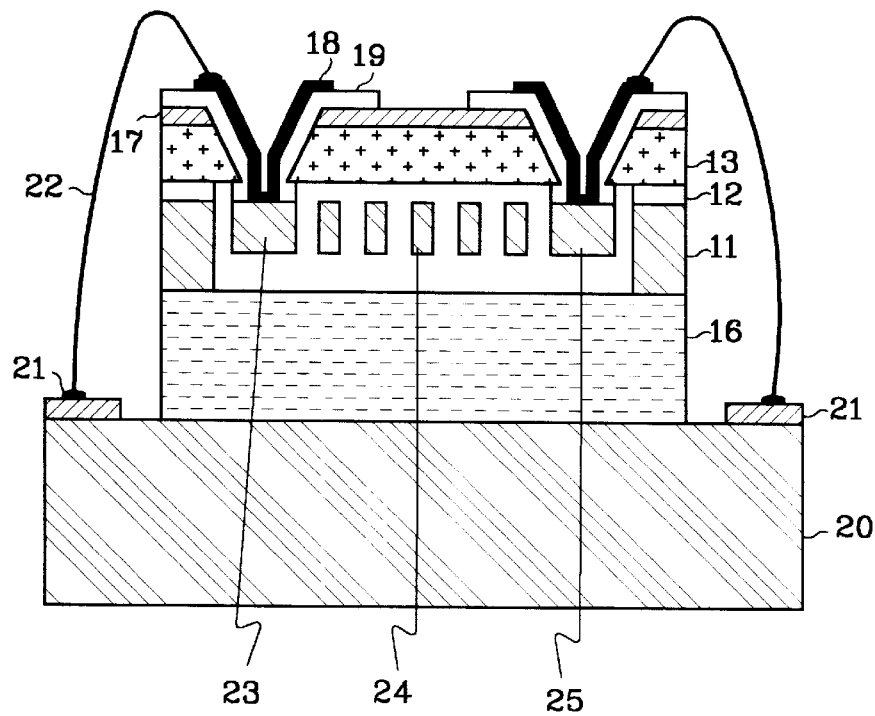

The present invention relates to a method of manufacturing a vacuum micro-structure to be used for elements of microelectromechanical system (MEMS) or the like that operate in vacuum, and more particularly, to a method of fabricating a MEMS structure by connecting the vacuum micro-structure with external elements.

2. Description of Related Art

An example of the related art is a method of encapsulating a microelectronic device in a vacuum chamber through a surface process, which is proposed by Boysel et al. (U.S. Pat. No. 5,354,714, Oct. 11, 1994, "Method of forming a vacuum micro-chamber for encapsulating a microelectronic device"). This method includes the steps of preparing a device on a substrate, applying an organic agent such as photoresist on the surface of the device to define a pattern, depositing a metal film, forming an open window in the metal film coated on the photoresist in order to remove the photoresist confined inside the metal film, and decomposing the photoresist to be removed with a solvent or the like. According to the method, the open window is hermetically sealed by a metal film redeposition step performed in a vacuum, thereby manufacturing a vacuum micro-element. This method, however, has a problem in that it is inapplicable to a large-sized vacuum structure because the thickness of the thin film used as a sealing material is limited to several micrometers and the vacuum pressure may transform the vacuum structure.

Another method involves use of a small-sized vacuum can but is disadvantageous in that mass productivity is poor because packaging is performed in the unit of element.

Generally, an angular velocity sensor with a vacuum microstructure that is manufactured by processing a silicon wafer in the semiconductor process includes a comb-like drive and detection electrode and a spring beam which are spatially floating over the substrate. When driving the angular velocity sensor at high frequency, however, the internal space of the structure must be kept in vacuum.

SUMMARY OF THE INVENTION

Accordingly, the present invention is directed to a method of fabricating a vacuum micro-structure that substantially obviates one or more of the limitations and disadvantages of the related art.

An object of the present invention is to provide a method of fabricating a vacuum micro-structure which is to prepare a high vacuum micro-space as well as vacuum structure floating in a micro-space such that the vacuum microstructure is easy to use together with normal chips by improving the related art methods for encapsulating driver chips, such as performing deposition or using a small-sized vacuum can, and enabling manufacture of the vacuum micro-structure through a process performed in the unit of wafer.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a method of fabricating a vacuum microstructure, which is used for an element operating in a vacuum, includes the steps of: (1) entirely etching an epitaxial layer of a silicon substrate having an SOI structure including an upper silicon epitaxial layer, an interlevel insulating layer and a lower silicon bulk layer to form two electrode structures and a floating vibratory structure, and encapsulating them with a vacuum sealing substrate in a vacuum; and (2) etching the silicon substrate having the SOI stricture from the back side to the interlevel insulating layer to open the electrode structures, and forming a metal electrode. According to the present invention, it is possible to mount the vacuum micro-structure formed on the surface of a wafer in a high vacuum by anodic bonding and perform a batch processing and packaging in the unit of wafer such as IC chip.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a cross-sectional view showing that a hermetic vacuum unit driving micro-structure is electrically connected to the external substrate or another chip; and FIGS. 2a–2m are cross-sectional views showing the procedure of fabricating a vacuum vibratory micro-element using a silicon substrate having an SOI structure.

DETAILED DESCRIPTION OF PREFERRED EMBODIMENT

Reference will now be made in detail to the preferred embodiments of a method of fabricating a vacuum microstructure according to the present invention, examples of which are illustrated in the accompanying drawings.

FIG. 1 is a cross-sectional view showing a method of mounting a vacuum micro-element on another substrate after dicing step. Referring to FIG. 1(a), SOI type silicon substrates 11, 12 and 13 having a polysilicon or single crystalline silicon thin film are used to form electrode structures 23 and 25 and a floating vibratory structure 24 by recess etching or surface etching of silicon and oxide scarifying layer. The vibratory structure formed on the surface of the SOI substrates is sealed in vacuum with a hermetical substrate 16. Being drawn from the back side of the SOI substrates through metallization in electrode structures 23 and 25 required to drive the vibratory structure, a metal electrode 19 is connected to a metal pad 21 via bonding wire 22. Use is made of a silicon nitride layer 17 as an etching protective layer for etching silicon on the back side of the SOI substrates and a silicon oxide layer 18 as an electrode insulating layer. Reference numeral 12 denotes a silicon oxide layer buried on the SOI substrates.

Driving the vacuum micro-structure is based on the principle that an ac voltage applied to electrode structures 23 and 25 having a comb or plate form and engaged with each other drives the vacuum micro-structure by means of the electrostatic force of the electrode structures 23 and 25 and the vibratory structure 24.

Figure 1B:
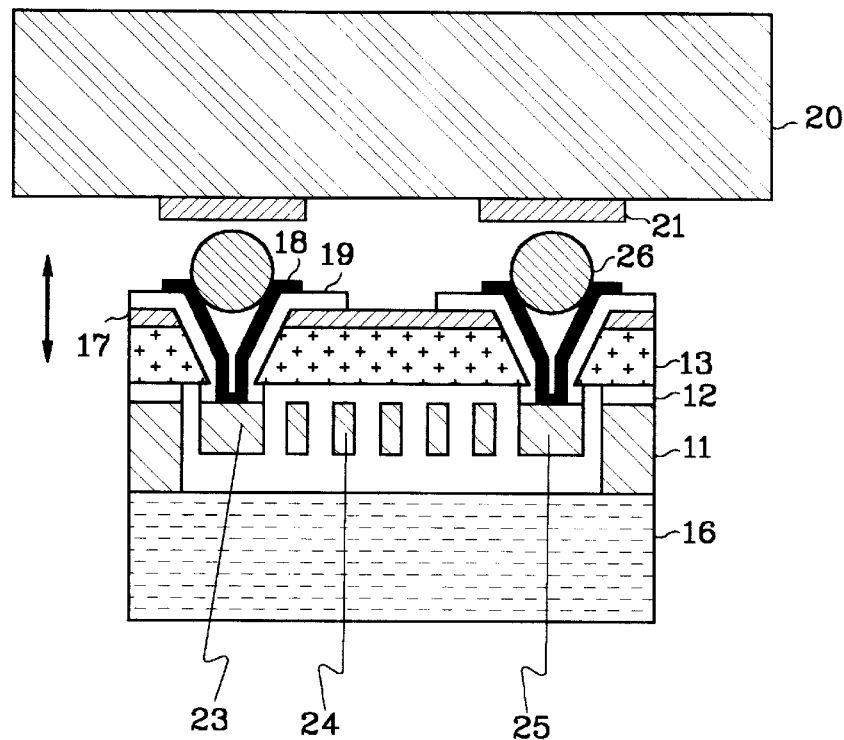

FIG. 1b illustrates a method for mounting a vacuum microelement having the same structure on an external substrate for bonding external circuits or IC chip 20, in which the vacuum microelement is directly connected with a external substrate metal pad 21 via a flip bonding metal ball 26.

FIGS. 2a–2m are cross-sectional views showing the procedures for fabricating a vacuum micro-structure with an SOI substrate.

Figure 2A:
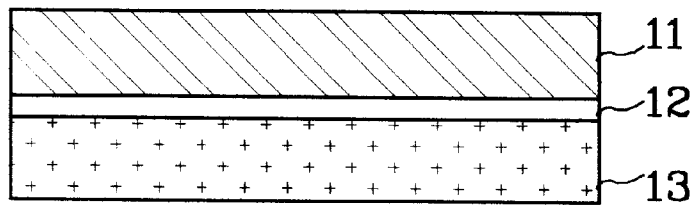

FIG. 2a shows an SOI substrate having laminated silicon/silicon oxide layer/silicon, in which reference numeral 11 denotes a silicon epitaxial layer having low resistance, reference numeral 12 a silicon oxide layer used as an interlevel insulating layer, reference numeral 13 a silicon substrate. The interlevel insulating layer 12 and the silicon epitaxial layer 11 are laminated on the silicon substrate 13.

Figure 2B:
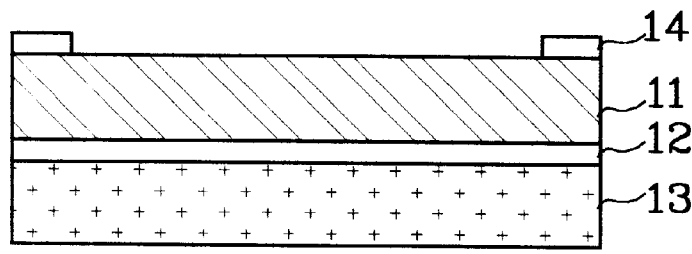

As shown in FIG. 2b, in order to etch the silicon epitaxial layer of the region to become a vacuum structure in an SOI substrate, an oxide layer 14 is deposited as an etching masking film and etched by lithography to define recess etching masking oxide layer 14.

Figure 2C:
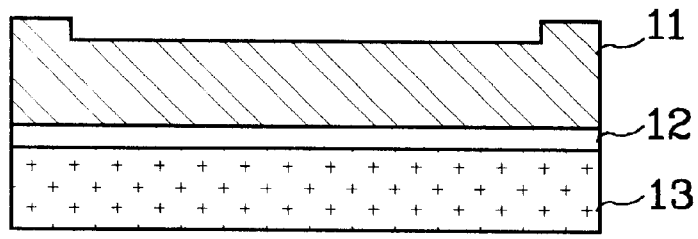

As shown in FIG. 2c, the silicon epitaxial layer 11 is etched to have a predetermined thickness by using the recess etching masking oxide layer 14 as a mask and the etching masking oxide layer 14 is removed to form a vacuum sealing projection.

Figure 2D:
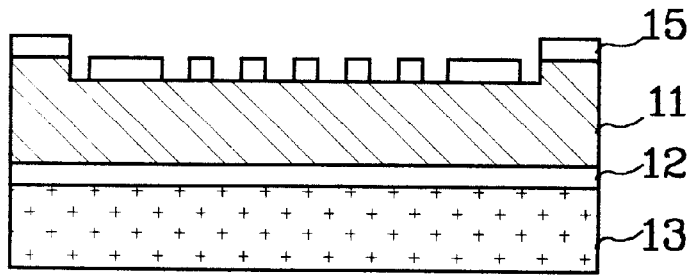

As shown in FIG. 2d, a silicon etching masking oxide layer 15 is deposited again on the result of the step shown in FIG. 2c and etched to form a patterns of comb-like electrode vibratory structures by lithography, thereby forming a structure pattern masking oxide layer.

Figure 2E:
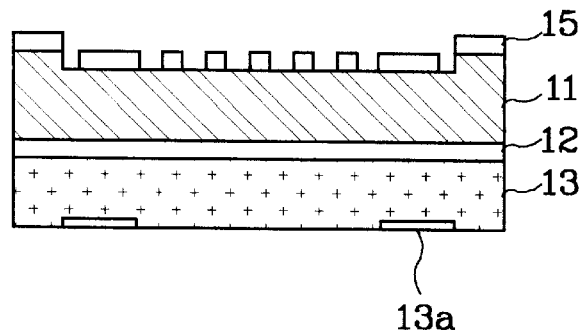

As shown in FIG. 2e, the silicon substrate 13 is etched from the back side by lithography using a double-side aligned in order to align the epitaxial layer with the electrode in opening an electrode contact window on the back side of the SOI substrate, to form an imprinting pattern 13a.

Figure 2F:
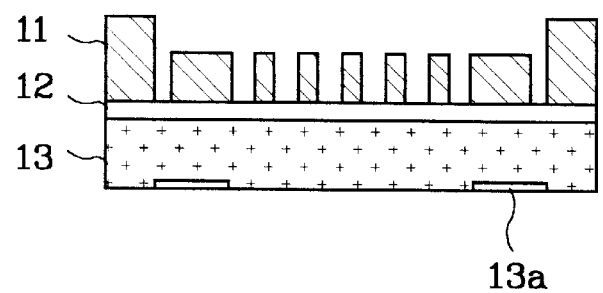

As shown in FIG. 2f, the structure pattern masking oxide layer 15 (FIG. 2d) having the pattern of vibratory and electrode structures is used as a masking film for silicon etching to vertically etch the silicon epitaxial layer 11 down to the upper surface of the silicon oxide layer 12 by plasma method.

Figure 2G:
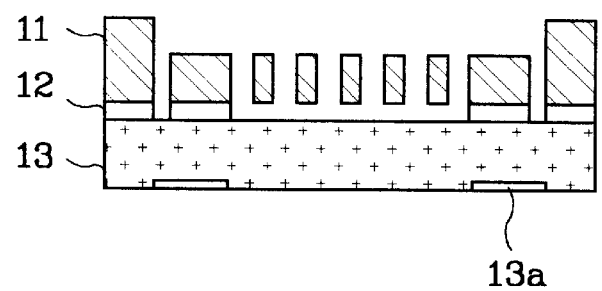

As shown in FIG. 2g, the oxide layer 12 used as a scarifying layer underlying the silicon vibratory structure is removed by gas phase etching (GPE) such that the silicon vibratory structure three-dimensionally connected to an anchor or a spring beam is etched while it is spatially floating.

Figure 2H:
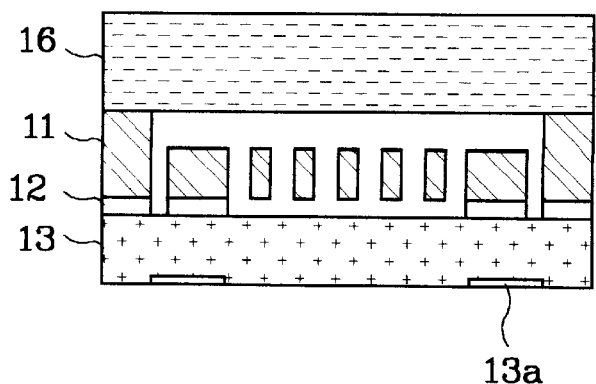

As shown in FIG. 2h, after the silicon vibratory structure (reference numeral 24 in FIG. 1a) is completed on the SOI substrate, another silicon or glass wafer 16 is used to bond the upper surface of the silicon vibratory structure by anodic bonding in a high vacuum chamber, thereby sealing the micro-space hermetically.

Figure 2I:
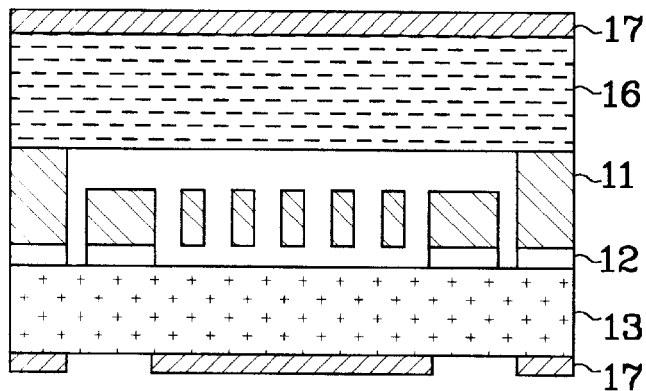

As shown in FIG. 2i, a silicon nitride ($Si_3N_4$) layer 17 is deposited as a silicon etching masking film for opening a contact window of the internal electrode of the vacuum micro-structure having a double wafer bonded structure and etched by lithography to open the silicon nitride layer 17 in the contact window region on the back side of the SOI wafer.

Figure 2J:
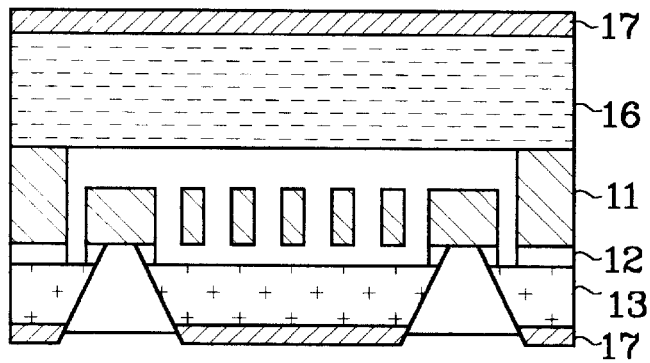

As shown in FIG. 2j, the silicon substrate 13 on the back side of the SOI wafer is etched to have a deep slanting structure with an etching solution such as KOH having an etching orientation for silicon crystalline structure by using the silicon nitride layer 17 as a silicon etching masking film. The silicon oxide layer 12 is etched by an ion-reactive plasma method to open the silicon electrode structures (reference numerals 23 and 25 in FIG. 1a) confined in a vacuum.

Figure 2K:
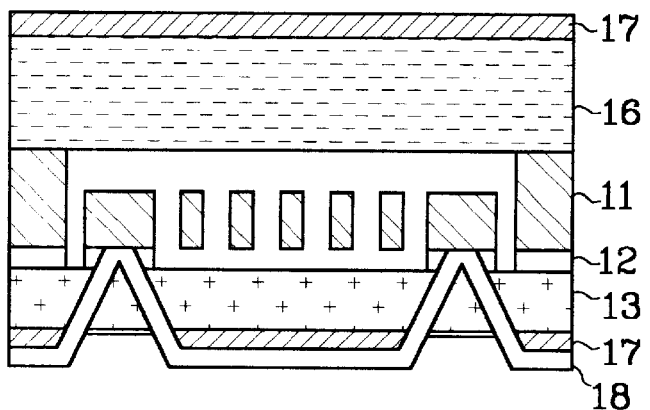

As shown in FIG. 2k, an insulating oxide layer 18 is deposited for electrical insulation between the open silicon electrode structures 23 and 25 and the silicon substrate when forming an electrode with a metal film.

Figure 2L:
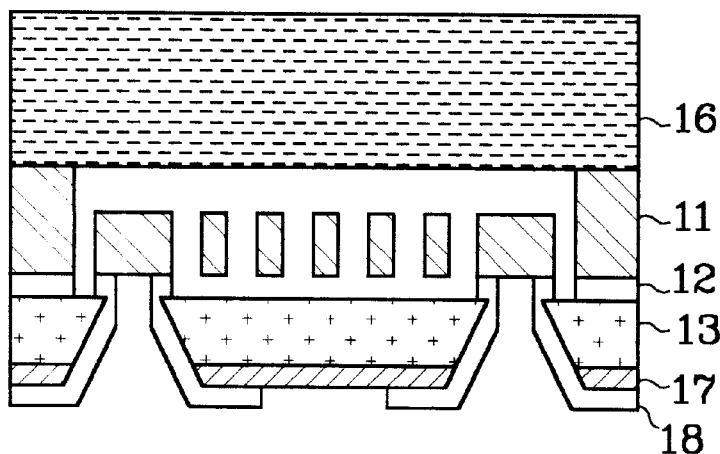

As shown in FIG. 2l, the insulating oxide layer 18 deposited on the silicon electrode structures 23 and 25 are opened by lithography.

Figure 2M:
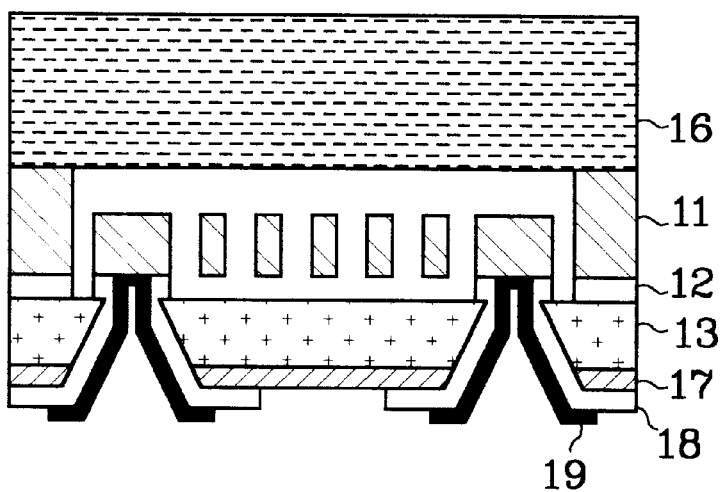

As shown in FIG. 2m, a metal film 19 consisting of aluminum (Al) or the like is deposited and a bonding external substrate electrode pad (reference numeral 21 in FIG. 1a) is defined by lithography, followed by metallization.

Thus completed device can be fabricated in such a way as illustrated in FIGS. 1a and 1b.

Such as in the present invention described above, use is made of the silicon substrate having an SOI structure to divide the upper silicon epitaxial layer and the lower silicon bulk layer as regions for forming a driving structure and an electrode, respectively, resulting in a structure that makes it possible to mount the micro-structure formed on a wafer in a high vacuum by means of anodic bonding and enable a batch processing and packaging in the unit of wafer such as IC chip.

Consequently, the present invention eliminates a process for mounting angular velocity sensors one by one based on the sensor chip in a vacuum after wafer process. Furthermore, the present invention sensor structure uses a flip bonding metal ball to the slanting contact window structure in the step of electrical wiring with another chip or substrate, thereby improving the performance of device.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents.

What is claimed is:

1. A method of fabricating a vacuum micro-structure, which is used for an element operating in a vacuum, the method comprising the steps of:

(1) entirely etching an epitaxial layer of a silicon substrate having an SOI structure including an upper silicon epitaxial layer, an interlevel insulating layer and a lower silicon bulk layer to form two electrode structures and a floating vibratory structure, and encapsulating them with a vacuum sealing substrate in a vacuum; and (2) etching the silicon substrate having the SOI structure from the back side to the interlevel insulating layer to open the electrode structures, and forming a metal electrode.

2. The method as claimed in claim 1, wherein the metal electrode of the completed vacuum micro-structure in use is electrically connected to an IC chip or an external substrate for connection with external circuits via a bonding metal wire.

3. The method as claimed in claim 1, wherein the metal electrode of the completed vacuum micro-structure in use is electrically connected to an external substrate via a flip bonding metal ball.

4. The method as claimed in claim 1, wherein the step (1) comprises the steps of:
   (a) etching the epitaxial layer by using a first oxide layer at both ends of the epitaxial layer of the SOI structure as a mask and removing the oxide layer to form a vacuum sealing projection;
   (b) forming a second oxide layer on the whole surface of the result of step (1), defining a pattern of comb-like electrode and vibratory structures by lithography, and etching the lower bulk layer of the SOI structure by lithography in order to align the patterns with an electrode to be formed on the epitaxial layer, thereby forming an imprinting pattern;
   (c) vertically etching the epitaxial layer by plasma technique using the second oxide layer as a mask; and
   (d) removing the interlevel insulating layer used as a scarifying layer underlying the vibratory structure to form the floating vibratory structure, and bonding with the vacuum sealing substrate hermetically.

5. The method as claimed in claim 4, wherein in the step (b), the imprinting pattern is formed by lithography using a both-sided aligned.

6. The method as claimed in claim 4, wherein the interlevel insulating layer used as a scarifying layer is removed by gas phase etching (GPE).

7. The method as claimed in claim 4, wherein the vacuum sealing substrate is hermetically bonded by anodic bonding in a high vacuum chamber.

8. The method as claimed in claim 1, wherein the step (2) comprises the steps of:
   (a) depositing a silicon nitride layer underlying the lower silicon bulk layer to open a contact window for bonding the electrode structures, and etching the contact window region by lithography;
   (b) etching down to the interlevel insulating layer underlying the electrode structures by using the remaining silicon nitride layer as a mask to open the electrode structures
   (c) depositing a third oxide layer for insulation between the opened electrode structures and the external substrate; and
   (d) etching the third oxide layer by lithography to open the electrode structures again, and forming an aluminum metal electrode.

9. The method as claimed in claim 8, wherein in the step (b), the lower silicon bulk layer is etched in the crystallization direction of the silicon substrate to have a deep slanting structure with an KOH etching solution by using the silicon nitride layer as a mask, and the interlevel insulating layer is etching by an ion-reactive plasma method.

* * * * *